United States Patent [19]

Patterson et al.

[11] Patent Number: 5,365,175
[45] Date of Patent: Nov. 15, 1994

[54] METHOD OF LOCATING GROUND FAULTS

[75] Inventors: Richard L. Patterson, South Euclid, Ohio; Allen H. Rose, Boulder, Colo.; Ronald C. Cull, Milan, Ohio

[73] Assignee: The United States of America as represented by the Administrator of the National Aeronautics and Space Administration, Washington, D.C.

[21] Appl. No.: 6,413

[22] Filed: Jan. 21, 1993

[51] Int. Cl.⁵ .......................................... G01R 31/08
[52] U.S. Cl. ...................................... 324/501; 324/509; 324/512; 324/539; 324/96
[58] Field of Search ............... 324/501, 509, 510, 512, 324/539, 542, 96, 117 R; 361/42

[56] References Cited

U.S. PATENT DOCUMENTS

| | | | |
|---|---|---|---|
| 4,037,155 | 7/1977 | Ahmed | 324/509 X |
| 4,370,612 | 1/1983 | Puech et al. | 324/117 R |
| 4,477,768 | 10/1984 | Hiramoto et al. | 324/510 |
| 4,539,519 | 9/1985 | Ulrich et al. | 324/117 |
| 4,563,639 | 1/1986 | Langeac | 324/96 |
| 4,613,811 | 9/1986 | Vaerewyck et al. | 324/96 |
| 4,797,607 | 1/1989 | Dupraz | 324/96 |
| 4,814,930 | 3/1989 | Abe et al. | 361/44 |
| 4,931,894 | 6/1990 | Legatti | 361/45 |
| 5,042,905 | 8/1991 | Anjan et al. | 385/13 |
| 5,051,577 | 9/1991 | Lutz et al. | 324/96 X |
| 5,136,235 | 8/1992 | Brändle et al. | 324/96 |
| 5,237,265 | 8/1993 | Peier et al. | 324/96 |
| 5,256,872 | 10/1993 | Barrault et al. | 324/96 X |

Primary Examiner—Walter E. Snow
Assistant Examiner—Glenn W. Brown
Attorney, Agent, or Firm—Gene E. Shook; Guy M. Miller

[57] ABSTRACT

The present invention discloses a method of detecting and locating current imbalances such as ground faults in multiwire systems using the Faraday effect. As an example, for 2-wire or 3-wire (1 ground wire) electrical systems, light is transmitted along an optical path which is exposed to magnetic fields produced by currents flowing in the hot and neutral wires. The rotations produced by these two magnetic fields cancel each other, therefore light on the optical path does not read the effect of either. However, when a ground fault occurs, the optical path is exposed to a net Faraday effect rotation due to the current imbalance thereby exposing the ground fault.

3 Claims, 3 Drawing Sheets

METHOD OF LOCATING GROUND FAULTS

ORIGIN OF THE INVENTION

The invention described herein was made by employees of the U.S. Government and may be manufactured and used by or for the Government for governmental purposes without the payment of any royalties thereon or therefor.

FIELD OF THE INVENTION

The present invention is directed towards detecting and locating electrical current imbalances such as ground faults in modern multiwire power systems. For example, in modern 3-wire power systems, two wires supply power from the source to the load and a third wire is added to hold any outside metal covering at zero volts for safety purposes. However, when outside intervention occurs, offering an alternate path to ground, current may flow from the current carrying wires through the alternate path thereby producing a ground fault.

The prior art technique of protecting against ground faults uses differential transformers and ground fault interrupters. In these systems the differential transformer would detect the ground fault, and the ground fault interrupter would then disconnect the hot wire terminating the shocking hazard.

The differential transformer system has the disadvantage that it only works on AC systems. Therefore, DC ground fault detectors must rely on the summing of currents in and out of nodes. This requires a high degree of current measuring accuracy, and a small, possibly lethal, current may go unnoticed. Electrical isolation of these detectors is also very difficult in these systems. Abnormal high voltages can pass on the lines connected to low voltage electronics and destroy them. In addition, wires connecting the differential transformers to the processing electronics can also act as antennas, making them susceptible to electromagnetic interference and electromagnetic pulses.

It is therefore an objective of the present invention to provide a method of ground fault detection that has very high isolation between the sensing head and any other piece of equipment resulting from the use of a totally optical connection.

A further objective of this invention is to provide a technique that has intrinsic immunity from electromagnetic interference and electromagnetic pulses which facilitates non-capacitive and non-inductive sensing without interacting with the equipment on which the measurement is being made.

DESCRIPTION OF THE RELATED ART

U.S. Pat. No. 4,539,519 by Ulrich discloses a method of insuring the constancy of zero point in a fiber optic sensor. The process utilizes reflecting mirrors and a polarization servo, and it is not directed to the detection of ground faults.

U.S. Pat. No. 4,613,811 by Vaerewyck discloses a Faraday effect current sensor which compensates for thermal effects in the monitoring apparatus.

U.S. Pat. No. 4,797,607 by Dupraz is directed to an apparatus for updating the response scaling factor of an optical electrical current sensor using an interferometer.

U.S. Pat. No. 4,814,930 by Abe is directed to an apparatus comprised of multiple sensing heads to detect light after beam splitting is performed. U.S. Pat. No. 4,931,894 by Legatti is a ground fault detector that uses a differential transformer. U.S. Pat. No. 5,042,905 by Artjan is directed to a device that detects mechanical position by using the Faraday effect.

SUMMARY OF THE INVENTION

The present invention uses the Faraday effect to detect and locate current imbalances such as ground faults in electrical systems. A fiber optic coil is created by winding a fiber optic cable to create an optical path for the transmission of light. The wires expected to carry current in non ground fault conditions are then positioned to pass through the optical coil. If the currents in the wires do not sum to zero, then the resulting unbalanced magnetic fields and currents can be detected by detecting the net Faraday rotation of the polarization state of the light in the fiber optic cable. As an example, for a 2-wire or a 3-wire (1 ground) system, both the hot and neutral wires are connected from the source to the load, with the hot wire serving as a current path from source to load and the neutral wire serving as a return path. When current is transmitted on the hot and neutral wires, magnetic fields are generated. The currents in the hot and neutral wires are in equal and opposite directions, producing equal and opposite magnetic fields.

When light having a linear state of polarization is transmitted along the optical path, it will experience a normal rotation in the linear state of polarization when there is a magnetic field to produce the Faraday effect. When a ground fault occurs, the current in the hot wire will increase, changing the current balance. Only currents which flowed through the load will flow back to the source on the neutral wire. Thus, near the source, current-flows in the hot and neutral leads will be unbalanced. The fiber optic coil responding to the magnetic fields generated by current flow through the hot and neutral leads detects the unbalanced current flow.

As a result, the fiber optic coil responds to the unbalanced magnetic fields via the Faraday effect causing a net Faraday rotation of the polarization state of light which is being propagated in the fiber optic coil, thereby signalling a ground fault.

BRIEF DESCRIPTION OF THE DRAWINGS

The objects, advantages, and novel features of the invention will be more fully apparent from the following detailed description when read in conjunction with the accompanying drawings wherein.

DETAILED DESCRIPTION OF THE BEST MODE

Figure 1:
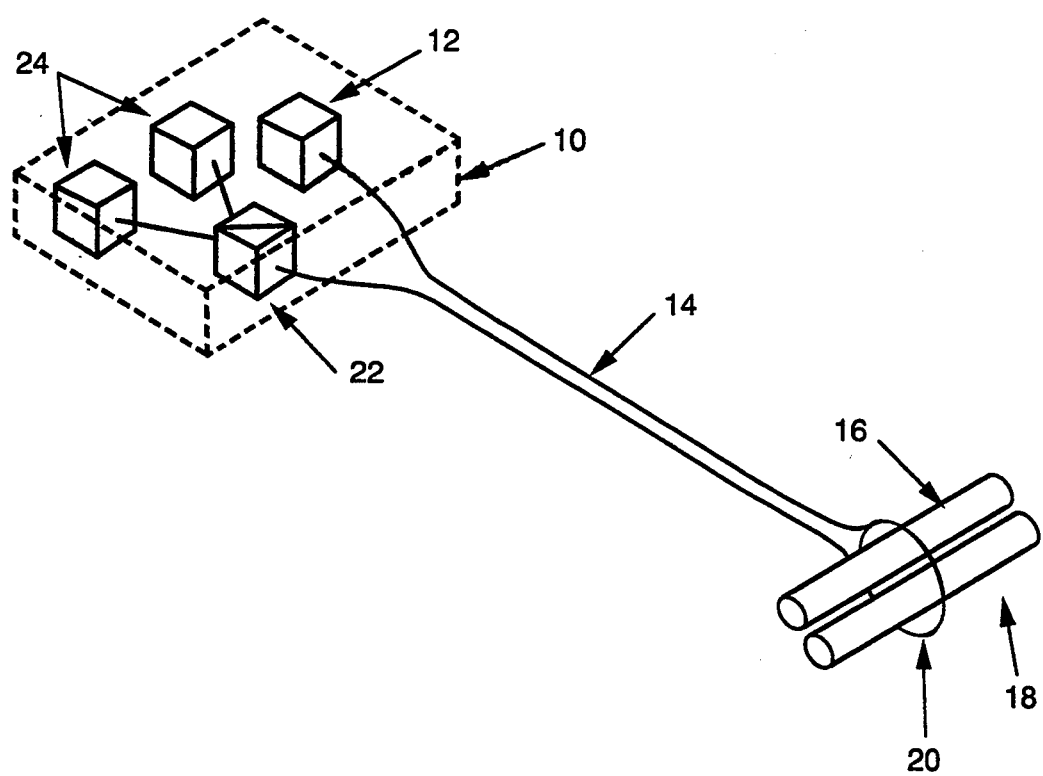
FIG. 1 is a schematic view of the apparatus used to perform the method of the present invention.

The present invention is directed to a method of detecting and locating current imbalances such as ground faults in multiwire electrical systems using the Faraday effect. The Faraday effect is the rotation of the polarization state of a linearly polarized beam of light in the presence of a magnetic field when the direction of the optical path and the direction of the magnetic field are parallel. This is described mathematically in the following equation. For a diamagnetic material, such as a glass fiber, the Faraday effect is, $$\theta_F = V \int B \cdot dl \tag{1}$$

where $\theta_F$ is the Faraday rotation of the linearly polarized light, B is the magnetic flux and dl is the optical path. If the optical path is circular around a wire carrying a current I, then Ampere's law and the relation $B = \mu H$ can be used to write the rotation as follows:

$$I = \phi H \cdot dl \tag{2}$$

$$\theta_F = \mu V N I. \tag{3}$$

For an optical fiber current sensor, the optical path is circular around the current carrying wire and equation 3 can be used. The rotation of the linearly polarized light propagating through the fiber is changed into an intensity modulation by a polarizing beam splitter. The axis of the polarizing beam splitter is set at 45° to the axis of the polarized light when no current is flowing in the wire. The equation that describes the intensity of the light after passing through the polarizing beam splitter is $$R\pm = \frac{A}{2}(1 \pm \sin 2\theta_F) \tag{4}$$

where A is a constant representing the optical loss through the sensor and the $\pm$ denote the two beams of light from the polarizing beam splitter. The light from the polarizing beam splitter is then placed on a photo-detector-amplifier that converts the optical intensity into a voltage for further signal processing.

The difference of the outputs from the photo-detectors is $$\Delta = A' \sin 2\theta_F \tag{5}$$

Where A' is a constant having the units of volts representing the amplifier gain and photo-detector response. The sum of the outputs from the photo-detectors is $$\Sigma = A'. \tag{6}$$

Taking the $\Delta/\Sigma$ provides an output that is theoretically free of amplifier drift and optical loss changes in the sensor.

For an optical fiber current sensor with two separate wires passing through the fiber loop, the rotation produced would be proportional to the sum of the individual rotation produced by each wire. For high frequency currents above 1 Mhz and fiber coils that have nonuniform linear birefringence, the position of the wires inside the fiber loop is important. For low frequency currents (60 Hz) or fiber coils with low (<80°) uniform linear birefringence, the position of the wires inside the fiber coil is not important. The equation that describes the sensor's response to currents flowing in two wires is $$\frac{\Delta}{\Sigma} = \sin\theta_{F1} + \sin\theta_{F2} \tag{7}$$

where the F1 and F2 distinguish the two wires. For small rotations (<10°) the equation can be written as $$\frac{\Delta}{\Sigma} = \mu V N (I_1 + I_2) \tag{8}$$

where $\theta_F$ is written using equation 3. If $I_1$ is equal and flowing in the opposite direction of $I_2$ then the output of the sensor $\Delta/\Sigma$ will be zero, but if the two currents are not equal, then the sensors will register an output.

FIG. 1 is a drawing of the fiber optic sensor used to implement the method disclosed in the present invention. An enclosure such as casing 10 houses the optic-electronic components used to generate and analyze the light used in the sensor. Linearly polarized light is generated by the laser 12 and is transmitted on the polarization maintaining fibers 14 through several turns of an annealed fiber optic coil 20. Two wires 16 and 18 conducting currents in opposite directions and connected from the same source to the same load are placed to pass through the annealed coil. The linearly polarized light is then transmitted along the polarization maintaining fibers 14 to a polarization beam splitter 22 that takes a rotation in the linear state of polarization and turns it into a magnitude. The magnitude is then split and read by the detectors 24 to assess whether a threshold value has been crossed, thereby detecting a ground fault.

Figure 2:
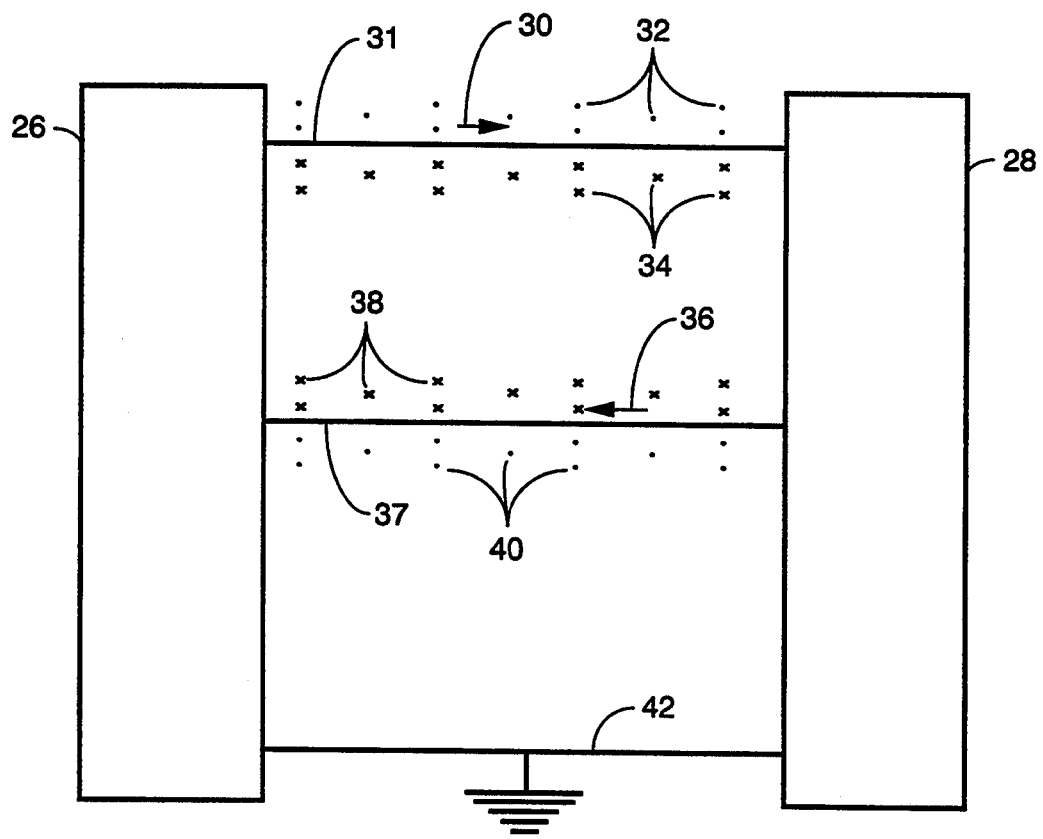
FIG. 2 is a schematic view illustrating a 3-wire circuit and the magnetic fields associated with the current running in the "hot" and "neutral" wires in accordance with the present invention.

The schematic of a 3-wire power supply system is displayed in FIG. 2. A current carrying wire 31 is displayed carrying a current 30 from a source 26 to a load 28. Following the convention of the right hand rule the current 30 generates a magnetic field circling the wire 31 by coming out of the page at 32 and entering the page at 34.

A return path is provided by a current carrying wire 37 which carries the current 36 from the load 28 to the source 26. Once again using the convention of the right hand rule, this would generate a circular magnetic field surrounding the current carrying wire 37 with the field going into the page at 38 and coming out of the page at 40. The fiber optic sensor responds to the fields generated by the currents to produce a net Faraday rotation that is zero.

Figure 3:
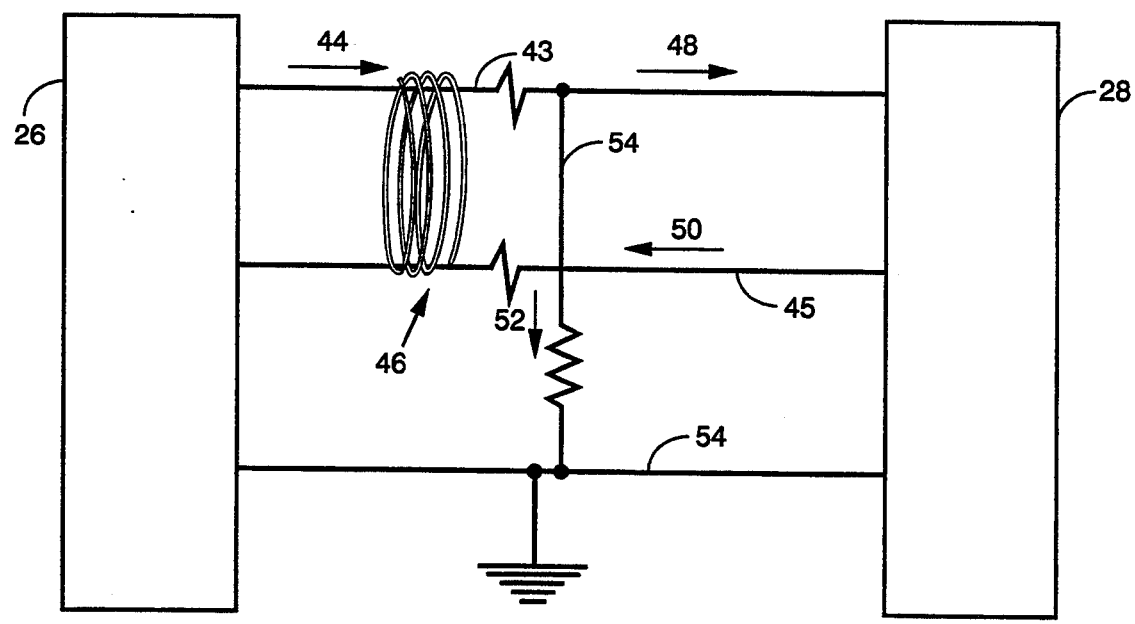
FIG. 3 is a schematic view of a 3-wire system showing the optical path and electrical currents associated with a ground fault.

FIG. 3 shows a schematic of a 3-wire power system in which a fiber optic path 46 is utilized. This path 46 is exposed to current carrying wires 43 and 45 in the three wire power system. When an alternate path 54 is introduced, current 44 leaving the source 26 on the current carrying wire 43, no longer equals the current 48 entering the load 28. In addition, current 52 is drawn by alternate path 54. Current 44 equals current 48 plus current 52; current 50 equals current 48 but flows in a direction opposite to current 48 (and opposite to current 44). The fiber sensor responds to current 44 and current 50, which means the fiber sensor responds essentially to current 52, i.e. the current imbalance.

Figure 4:
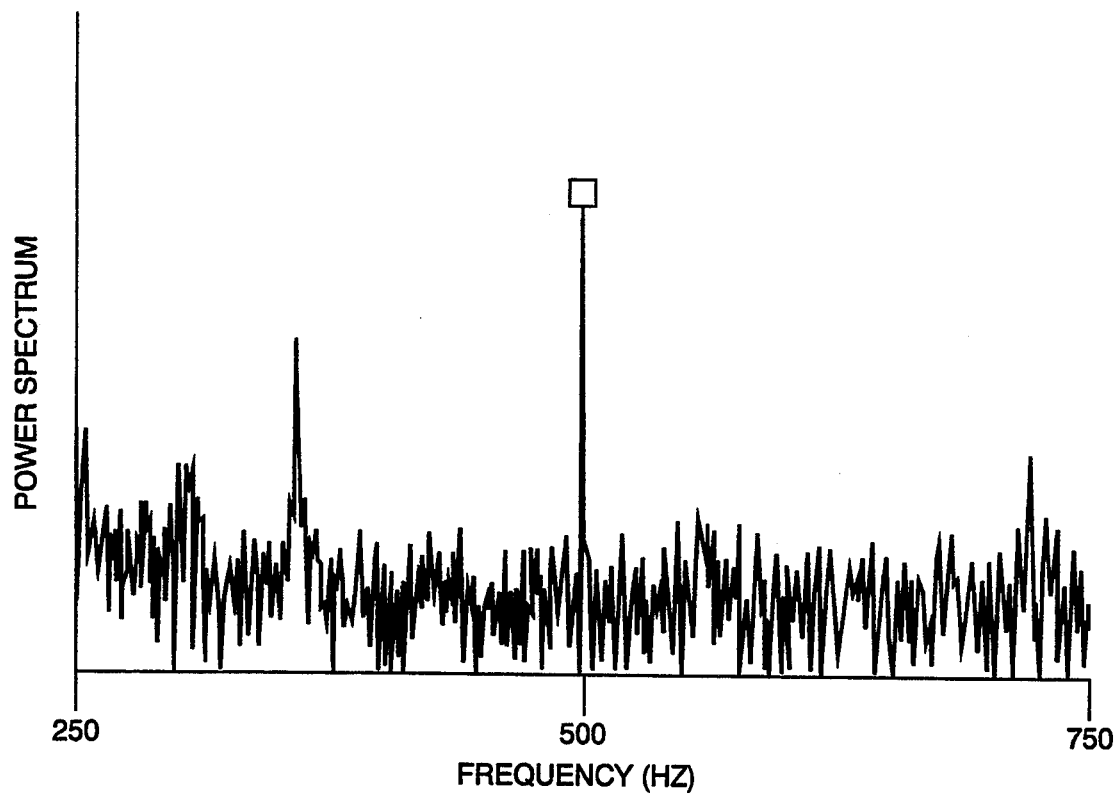
FIG. 4 is a graph displaying the current signal at 500 Hz produced when a ground fault occurred i n a test configuration.

The optical path used to verify the present invention had 55 turns of fiber with a diameter of 5 cm and a linear birefringence of about 30°. The measured noise equivalent current was 3.55 mA/$\sqrt{Hz}$ or a noise equivalent rotation of 1.1 $\mu$rad/$\sqrt{Hz}$. A one ampere current imbalance was used to produce the signal at 500 Hz in FIG. 4.

ALTERNATE EMBODIMENTS

Figure 5:
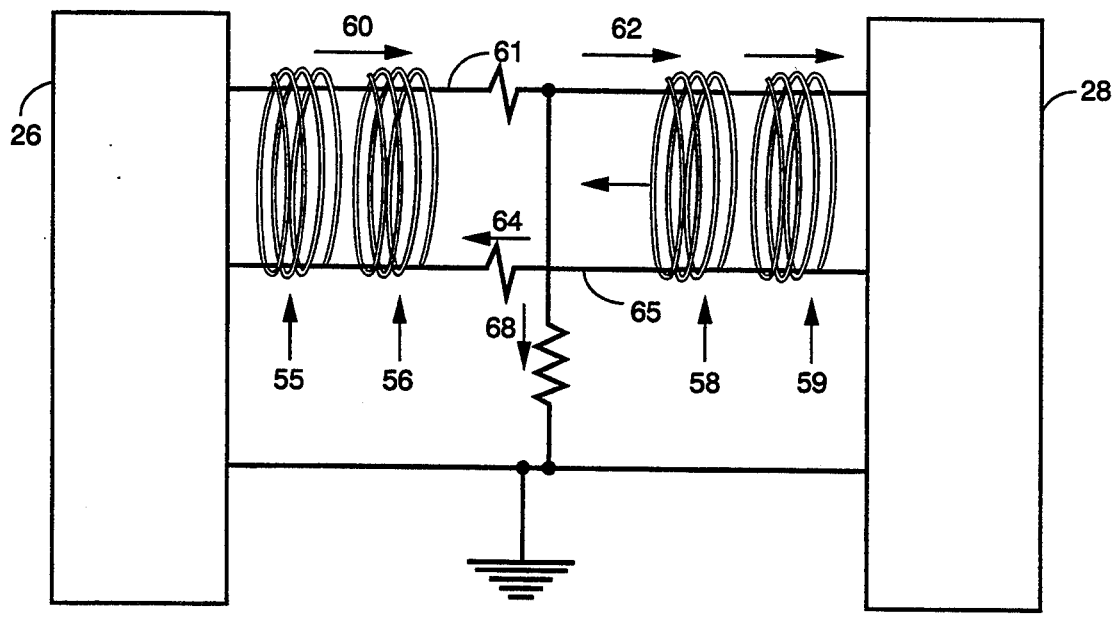
FIG. 5 is a schematic view showing several optical paths being used in a 3-wire power supply system to locate ground faults.

FIG. 5 displays an alternate method of using the present invention wherein the ground fault can be located. A plurality of optical paths 55, 56, 58, and 59 could be placed along the length of the current carrying conductors 61 and 65. Should a ground fault occur, the optical path 55 will be able to tell the difference between the current 60 and the current 64. After this detection, the sensing system will check the optical coil 56 to determine if any additional fault current had been detected. Having detected the same fault current, the sensing system would check optical coil 58.

Since 56 would detect a ground fault and 58 would not, the apparatus embodying the invention would be able to tell that a ground fault occurred between optical path 56 and optical path 58 thereby locating the ground fault.

Figure 6:
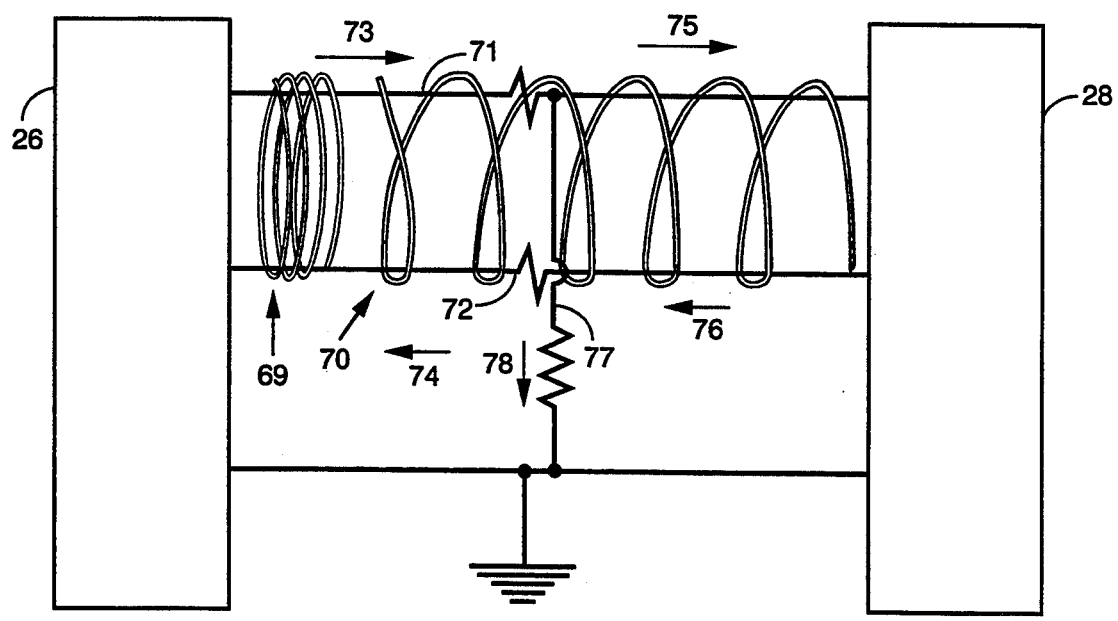
FIG. 6 is a schematic view showing an optical path distributed along the current carrying path in a 3-wire power supply system to locate ground faults.

FIG. 6 displays another method of using the present invention to locate ground faults. An optical path 69 is placed at the source 26 to measure the current imbalance of currents 73 and 74 in current carrying conductors 71 and 72. A second optical path 70 is distributed along the length of current carrying conductors 71 and 72. It would detect the current imbalance 78 caused by the ground fault 77 along the portion of the conductors 71 and 72 from the source 26 to the fault 77, but no current imbalance along the portion of conductors 71 and 72 from the fault 77 to the load 28. By comparing the current imbalance detected by optical path 69 with the current imbalance detected by optical path 70, the location of the fault could be determined.

For example, let optical paths 69 and 70 have the same number of turns and sensitivity, and let optical path 70 be evenly distributed along the length of the current carrying conductors 71 and 72. Then the ratio of current detected by optical path 70 to optical path 69 would equal the ratio of the distance from the source 26 to the ground fault 77 to the total distance from the source 26 to the load 28.

This could be implemented in the form of a cable with optical fiber wound in the insulation as the cable is fabricated. By employing connectors that couple both the electrical conductors and also the optical fibers, total systems could be constructed with fault detection and location built-in.

While several embodiments of the invention are disclosed and described it will be apparent that various modifications may be made without departing from the spirit of the invention or the scope of the subjoined claims.

What is claimed is:

1. A method of locating ground faults comprising the steps of;
    creating a plurality of circular optical paths, each for transmission of light having a linear state of polarization
    placing at least one pair of current carrying conductors including a forward and return path for current, within at least two of said circular optical paths,
    transmitting current on said forward path of said pair of current carrying conductors and returning current on said return path of said pair of current carrying conductors thereby exposing said optical paths to the Faraday effect produced by said current traveling on said forward and return paths of said pair of current carrying conductors,
    transmitting light having a linear state of polarization in said optical paths,
    detecting, in at least two optical paths, rotation in the linear state of polarization caused by said Faraday effect
    thereby signalling a ground fault, and
    locating said ground fault by comparing detected rotations in said at least two optical paths.

2. A method of locating ground faults including a source, a load, at least one first current carrying conductor for carrying a current from source to load, at least one second current carrying conductor for returning the current from load to source, a first fiber optic coil encircling said first and second current carrying conductors and a second fiber optic coil encircling said first and second current carrying conductors, with said second fiber optic coil extending along the length of the first and second current carrying conductors, said method comprising the steps of;
    transmitting current on said first conducting wire and returning current on said second conducting wire,
    transmitting light having a linear state of polarization on said first and said second fiber optic coil,
    detecting a rotation in the linear state of polarization of the light traveling in the first fiber optic coil thereby signalling a ground fault,
    detecting a rotation in the linear state of polarization in the light traveling in the second fiber optic cable thereby signalling a ground fault,
    comparing the current imbalance detected by said first fiber optic coil with said second fiber optic coil thereby locating the ground fault.

3. A method as claimed in claim 2 wherein said ground fault is located by taking a ratio of the current detected by said second fiber optic coil to the current detected in said first fiber optic coil,
    and equating said ratio to a ratio of a distance from the source to the ground fault to a distance from the source to the load.

* * * * *